(12) United States Patent
Mienkina et al.

(10) Patent No.: US 10,107,842 B2
(45) Date of Patent: Oct. 23, 2018

(54) LOW JITTER PULSE OUTPUT FOR POWER METER

(71) Applicants: Martin Mienkina, Bystrice (CZ); Radomir Kozub, Ostrava Poruba (CZ); Ludek Slosarcik, Ostrava-Bartovice (CZ); Lukas Vaculik, Valasske Mezirici (CZ)

(72) Inventors: Martin Mienkina, Bystrice (CZ); Radomir Kozub, Ostrava Poruba (CZ); Ludek Slosarcik, Ostrava-Bartovice (CZ); Lukas Vaculik, Valasske Mezirici (CZ)

(73) Assignee: NXP USA, Inc., Austin, TX (US)

( * ) Notice: Subject to any disclaimer, the term of this patent is extended or adjusted under 35 U.S.C. 154(b) by 256 days.

(21) Appl. No.: 15/025,042

(22) PCT Filed: Sep. 27, 2013

(86) PCT No.: PCT/IB2013/058921
§ 371 (c)(1),
(2) Date: Mar. 25, 2016

(87) PCT Pub. No.: WO2015/044715
PCT Pub. Date: Apr. 2, 2015

(65) Prior Publication Data
US 2016/0266180 A1    Sep. 15, 2016

(51) Int. Cl.
| | | |
|---|---|---|
| *G01R 21/127* | (2006.01) | |
| *G01R 21/133* | (2006.01) | |
| *G01R 22/06* | (2006.01) | |
| *G01R 35/04* | (2006.01) | |
| *G06F 1/26* | (2006.01) | |

(52) U.S. Cl.
CPC ......... *G01R 21/127* (2013.01); *G01R 21/133* (2013.01); *G01R 22/06* (2013.01); *G01R 35/04* (2013.01); *G06F 1/26* (2013.01)

(58) Field of Classification Search
CPC .... G01R 21/127; G01R 21/133; G01R 22/06; G06F 1/26
(Continued)

(56) References Cited

U.S. PATENT DOCUMENTS

| | | |
|---|---|---|
| 4,282,576 A | 8/1981 | Elms et al. |
| 6,429,637 B1 | 8/2002 | Gandhi |

(Continued)

FOREIGN PATENT DOCUMENTS

WO    9529409 A1    11/1995

OTHER PUBLICATIONS

Baker, M., "Creating a Reactive Energy Pulse Output Based on the ADE7753", http://www.analog.com/media/en/technical-documentation/application-notes/57571383197878AN_758_0.pdf, Analog Devices, 12 pages, 2005.

(Continued)

*Primary Examiner* — Mohamed Charioui
*Assistant Examiner* — Terence Stifter, Jr.

(57) ABSTRACT

There is provided an energy consumption meter device comprising including a processor arranged to receive input data from the sampling unit. The processor calculates at a calculation step [n] an energy contribution value using ΔE using a sampled voltage value and a sampled current value. The processor will calculate an energy value E[n] using a reminder value which was calculated at a previous calculation step [n−1]. The processor will then calculate a relative delay Td' using the threshold value, the reminder value and the energy value, and generate an output pulse at an output time tpulse which is delayed for the relative delay Td' with respect to the calculation time step[n]. By delaying the output pulse with a value which is a closest proximity of Td, the cycle-by-cycle jitter is less or equal to the clock frequency of the timer tclk.

11 Claims, 8 Drawing Sheets

(58) Field of Classification Search
USPC .......................................................... 702/61
See application file for complete search history.

(56) References Cited

U.S. PATENT DOCUMENTS

| | | | | |
|---|---|---|---|---|
| 6,522,982 | B1* | 2/2003 | Pastorello | G06J 1/00 |
| | | | | 324/110 |
| 6,735,535 | B1 | 5/2004 | Kagan et al. | |
| 2006/0033488 | A1 | 2/2006 | Gandhi | |
| 2010/0286935 | A1* | 11/2010 | Wendt | G01R 22/10 |
| | | | | 702/60 |

OTHER PUBLICATIONS

"Atmel AVR1631: Single Phase Energy Meter Using XMEGA A—8-bit Atmel Microcontroller", http://www.atmel.com/images/doc42039.pdf, Atmel Corporation, 39 pages, Nov. 2012.

Underwood, S. et al., "Implementation of a Three-Phase Electronic Watt-Hour Meter Using the MSP430F471xx", http://www.ti.com/lit/an/slaa409a/slaa409a.pdf, Texas Instruments, 31 pages, Jun. 2009.

"ESP430CE1, ESP430CE1A, ESP430CE1B Peripheral Modules", http://www.ti.com/lit/ug/slau134b/slau134b.pdf, Texas Instruments, 72 pages, 2008.

"Energy Metering ICs with Active Real Power Pulse Output", http://ww1.microchip.com/downloads/en/DeviceDoc/22011B.pdf, Microchip Technology Inc., 32 pages, 2011.

"Single Phase, Multifunction Metering IC with Neutral Current Measurement—Data Sheet (ADE7953)", Revision B, http://www.analog.com/static/imported-files/data_sheets/ADE7953.pdf, Analog Devices, Inc., 72 pages, 2011-2013.

"71M6521DE/DH/FE Energy Meter ICs—Data Sheet", Revision 3, http://www.mouser.com/ds/2/256/71M6521DE-71M6521FE-886.pdf, Maxim Integrated Products, Inc., Jul. 2012, 108 pages.

International Search Report for the International Application No. PCT/IB2013/058921 dated Jun. 16, 2014.

\* cited by examiner

Fig. 1
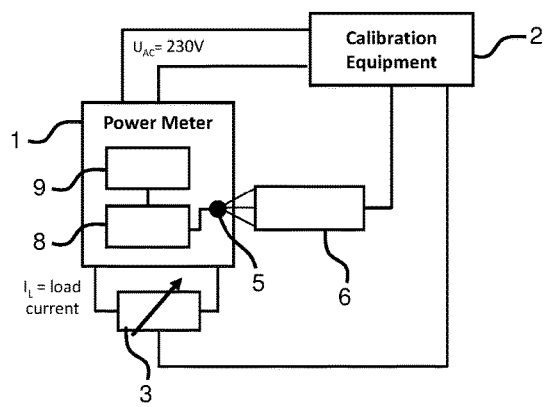
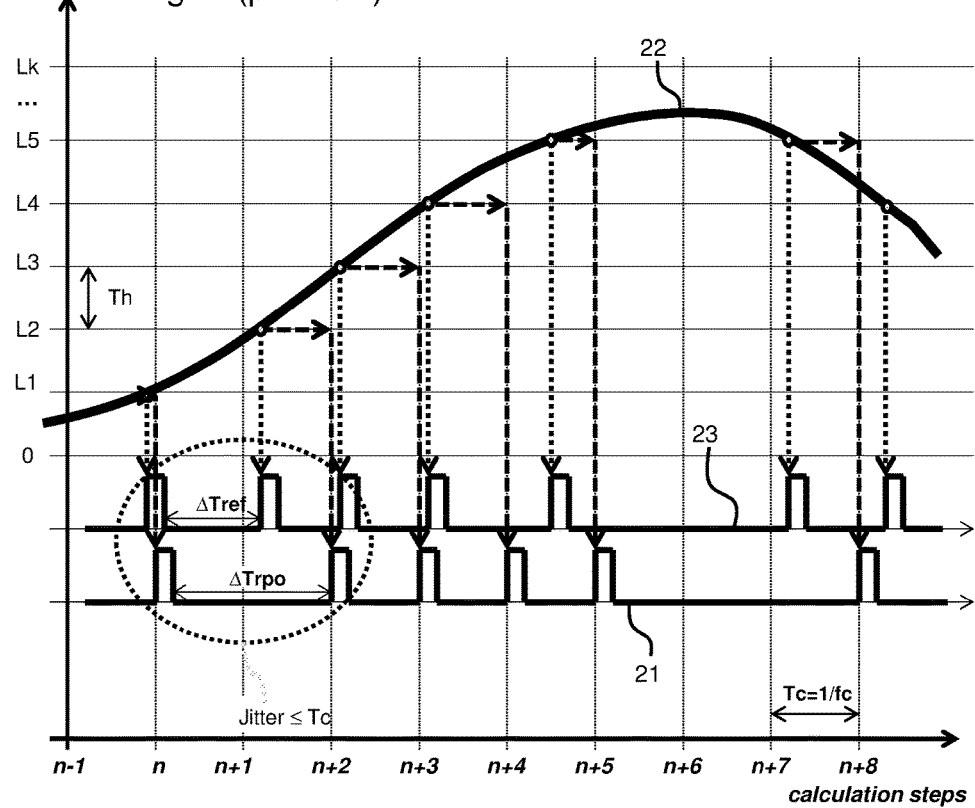
Fig. 2 (prior art)

LOW JITTER PULSE OUTPUT FOR POWER METER

FIELD OF THE INVENTION

This invention relates to an energy consumption meter device. It also relates to a method of generating a pulse, and to a computer program product.

BACKGROUND OF THE INVENTION

Power meters are used to measure consumption of electrical energy in households, companies or industry. Most power meters generate pulses on a so-called active energy kWh-LED. Each generated pulse relates to a predefined energy amount which is consumed by the load. The number of pulses generated per kWh is referred to as the pulse number "imp" which is typically between 1,000 and 100,000.

Before selling the power meters, manufacturers perform power meter calibration. FIG. 1 shows a possible configuration for a power meter calibration and testing of a power meter 1. A calibration equipment 2 supplies power with an alternating voltage $U_{AC}$. It also controls a load current $I_L$ using an adjustable load 3 connected to the power meter 1. The power meter 1 measures the load current $I_L$, the supply voltage $U_{AC}$ and uses these measurements to calculate an active energy consumption using formula:

$$E_A(t) = \int U_{AC}(t) I_L(t) dt \qquad \text{EQ.1}$$

where $E_A(t)$ is the active energy consumption at a time t.

Besides the calculation of the active energy consumption, the power meter 1 also transforms consumed energy consumption into a pulse stream on a LED 5, also referred to as the kWh-LED 5. For the purpose of calculation metering quantities and pulse generation, the power meter 1 comprises a microcontroller 8 and an analogue front-end (AFE) 9. The microcontroller 8 of the power meter 1 may also be arranged for driving human machine interfaces, communication, and controlling other tasks.

The calibration equipment 2 reads pulses generated by the power meter 1 through an optical head 6 and performs its back-transformation into an amount of consumed active energy. The calibration equipment 2 then compares the active energy consumption registered by the power meter 1 with the reference energy and calculates an energy error in percents. Energy errors for particular load points are documented in a power meter calibration protocol. The calibration protocol may comprise active energy errors measured in a variety of load points in four quadrants of operation.

The generated pulse output provided by the kWh-LED 5, driven by the power meter 1 can be jittery due to the presence of the 100 Hz component caused by the multiplication of the instantaneous 50 Hz voltage and current waveforms. As a consequence the active energy calibration may take longer. The longer the calibration time, the higher the cost of the production and the lower the production throughput. In an effort to lower the production cost and increase manufacturing bandwidth, it is necessary to shorten power meter test and calibration time. Conventional software based pulse output techniques prolong calibration time, hence cheaper and better solutions are needed. An ideal power meter generates pulse output with a frequency in the very high-dynamic range. For example, a power meter with 50,000 pulses/kWh, measuring phase currents in the range from 20 mA (starting current) up to 150 A (maximum current) and operating at voltages in the range from 207 V (Un−10%) up to 253 V (Un+10%), will toggle the kWh-LED 5 with frequencies ranging from 0.0575 Hz up to 527.083 Hz. The accuracy of the pulse output shall be ideally better than the accuracy of the calibration equipment (0.01%).

These pulse output requirements can be accomplished using a dedicated high-resolution (>=27-bit) pulse output hardware (ASIC) which is an expensive solution. Apart from dedicated pulse output analogue ASICs, the pulse output can be handled fully digitally by the microcontroller 8 of the power meter 1, or any other type of processor. The microcontroller 8 may receive a supply voltage $U_{AC}$ and a load current $I_L$ from the AFE 9. The digitized quantities may further be processed by software in a software loop or in a dedicated software task. The software may updates an active energy counter whenever new supply voltage $U_{AC}$ and load current $I_L$ samples can be read from the AFE 9. After the active energy counter is updated, its value is compared with defined pulse output threshold values; if its value crosses a next threshold then the software toggles an active energy pulse output. Hence the pulse output update rate equals the AFE output sample rate $f_{out}$. The inverse value of AFE output sample rate is referred to as the calculation step $T_c = 1/f_{out}$, also known as numerical integration step.

FIG. 2 shows a graph relating to a prior art method of generating a so-called "Rough Pulse Output" signal, see line 21. The method may be performed in a software loop or a dedicated software task executed on the microcontroller 8 of the power meter 1 or any other programmable logic device arranged in or in communication with the power meter 1.

In FIG. 2 the y-axis indicates the energy level $E_A$ where Lk is referring to an energy level equal to k*Th with k=0, 1, 2, . . . and the threshold Th being equal to 1/imp kWh. FIG. 2 shows a line 22 indicating the function of the active energy consumption $E_A(t)$ that is controlled by the calibration equipment 2 through adjustments of the load 3. The calibration equipment 2 generates a "Reference Pulse Output" signal 23 that represents instantaneous energy consumption. Contrary to the time-accurate "Reference Pulse Output" signal 23, the power meter 1 software generates the "Rough Pulse Output" signal 21 at calculation steps [n−1, n, . . . ].

In FIG. 2 a time gap $\Delta T_{ref}$ is referring to the time between a first pulse and a second pulse of the "Reference Pulse Output", and a time gap $\Delta T_{rpo}$ is referring to the time between a first pulse and a second pulse of the "Rough Pulse Output". The cycle-by-cycle jitter of such software generated "Rough Pulse Output" can be expressed as:

$$\text{Rough\_Pulse\_Output\_Jitter} = \Delta T_{ref} - \Delta T_{rpo} \in \langle 0, T_c \rangle \qquad \text{EQ.2}$$

where $T_c = 1/f_{out}$ is the calculation step and $f_{out}$ is the output sample rate of the AFE.

FIG. 3 shows a flow chart illustrating a method 30 of "Rough Pulse Output" generation according to the state of the art. The "Rough Pulse Output" is asserted with a resolution of the calculation step $T_c$.

The method 30 starts with reading phase voltage $U_{AC}$ and phase current $I_L$ samples from the AFE in a step 32. Then in a step 33, an energy contribution value $\Delta E$ is calculated. Next in a step 34, an energy value E[n] is calculated by adding a reminder value E[n−1] to the calculated $\Delta E$ value. Note that 'n' stands for the calculation step number of the present calculation step.

In a first test step 35, the energy value E[n] is compared to a positive threshold value (i.e. +1*Th). If the energy value is higher than the positive threshold value, the method continues with a step 36 that sets the temporary variable tmp to the positive threshold value, and next a step 39 in which a "Rough Pulse Output" signal is set to 1, and finally a step 41 where E[n−1] is calculated as energy value E[n] minus the temporary variable tmp.

If the first test step 35 is evaluated as false then execution of a second test step 37 begins. In the second test step 37, the energy value E[n] is compared to a negative threshold value (i.e. −1*Th). If the energy value E[n] is lower than the negative threshold value, the method continues with a step 38 that sets the temporary variable tmp to the negative threshold value, and next in step 39 the "Rough Pulse Output" signal is set to 1, and finally step 41 where E[n−1] is calculated as energy value E[n] minus the temporary variable tmp.

If none of the test steps 35 and 36 are evaluated as true then the reminder E[n−1] is set to the energy value E[n], see step 40. The method 30 is repeated in every calculation step Tc. As will be clear to the skilled reader, the pulse output will be set back to zero, but this clearing of the "Rough Pulse Output" signal is not relevant for understanding the principle hence not shown in the flow chart of FIG. 3.

The state of the art method described above can be executed using a software pulse output generator having a relatively simple implementation. It allows pulse output generation in a high dynamic range, but a relative long time is required for pulse averaging to eliminate the pulse output jitter.

The impact of pulse-per-pulse jitter on energy accuracy measurement can be explained by way of the following measurement configuration: power meter impulse number=50,000 pulses/kWh, input supply voltage $U_{AC}$=253 V, load current $I_L$=150 A and calculation step $T_c$=833.3 µs. The pulse output rate will equal to 527.083 Hz for given conditions. In order to guarantee accuracy of the active energy measurement in a range +/−0.01%, the calibration equipment 2 must continue averaging "Rough Pulse Output" pulses, which are generated with 833.3 µs jitter, for at least 4392.2 pulses, i.e. 833.3e-6/((1/527.083)*0.01/100). Hence a minimum test time for the conditions above is equal to 8.33 seconds.

The longer the testing of the power meter 1, the higher its manufacturing costs and the lower the factory production bandwidth.

SUMMARY OF THE INVENTION

The present invention provides an energy consumption meter device, a method of generating a pulse, and to a computer program product, as described in the accompanying claims.

Specific embodiments of the invention are set forth in the dependent claims.

These and other aspects of the invention will be apparent from and elucidated with reference to the embodiments described hereinafter.

BRIEF DESCRIPTION OF THE DRAWINGS

Further details, aspects and embodiments of the invention will be described, by way of example only, with reference to the drawings. Elements in the figures are illustrated for simplicity and clarity and have not necessarily been drawn to scale.

FIG. 1 schematically shows a possible configuration of a power meter calibration and testing of a power meter;

FIG. 2 shows a graph relating to a common method of generating a so-called "Rough Pulse Output" signal;

Elements in the figures are illustrated for simplicity and clarity and have not necessarily been drawn to scale. In the Figures, elements which correspond to elements already described may have the same reference numerals.

DETAILED DESCRIPTION OF THE PREFERRED EMBODIMENTS

A new pulse generation technique has been developed to overcome power meter test time issue. In an embodiment the high dynamic range pulse output is achieved by a software algorithm and a simple timer available on most of MCUs—these two elements enable the building of a low jitter pulse output system.

Figure 4:
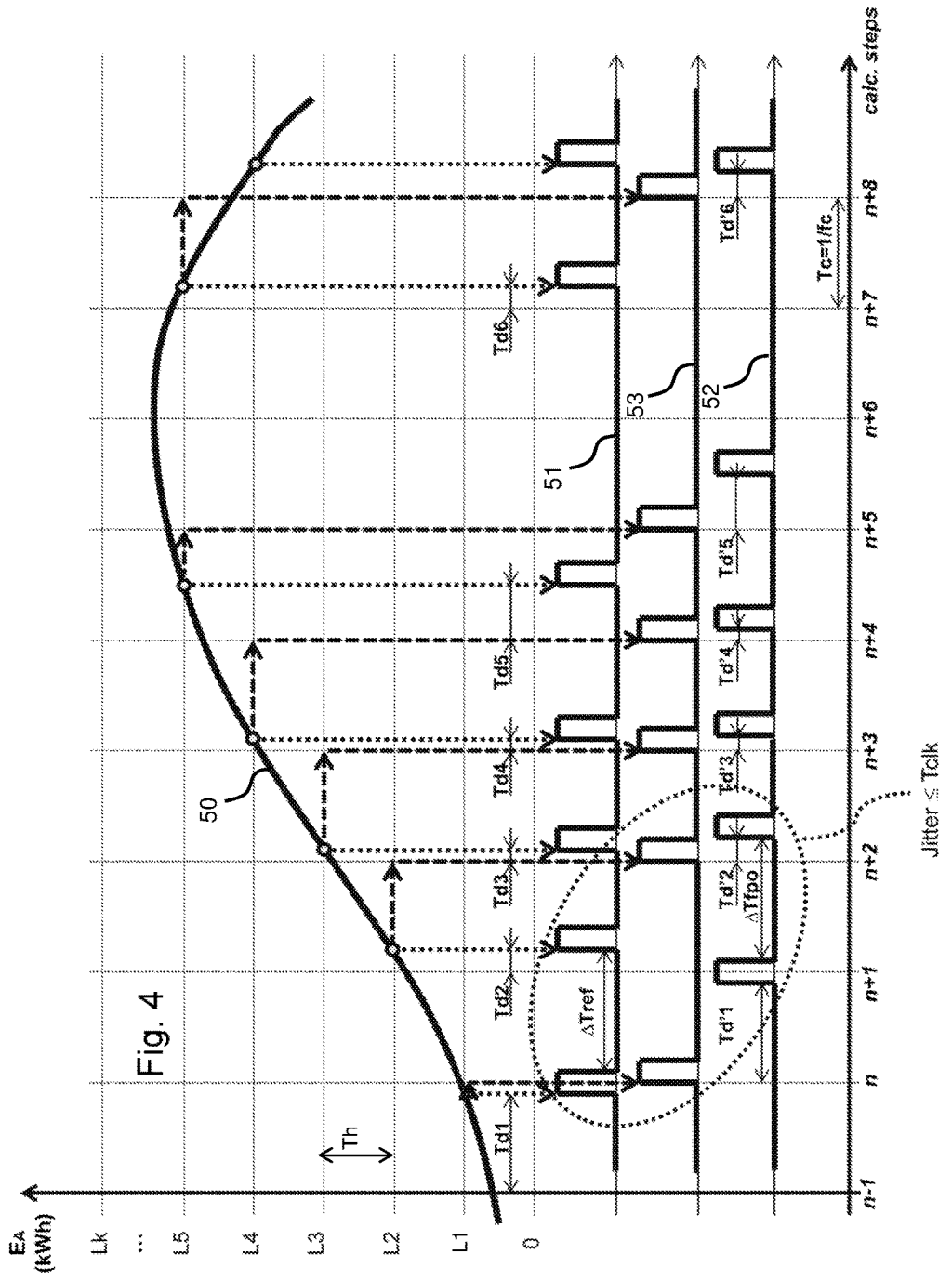
FIG. 4 shows a graph illustrating a pulse generation method according to an embodiment.

FIG. 4 shows a graph illustrating a pulse generation method according to an embodiment. A line 50 indicates the instantaneous active energy consumption $E_A$ (t) which is controlled by the calibration equipment 2 in a known way. For a given impulse number and energy consumption the calibration equipment 2 generates a "Reference Pulse Output" signal 51.

At discrete time intervals [n, n+1, . . . ] the software updates active energy counter and whenever updated counter value crosses an active energy level Lk with k=0, 1, 2, . . . , the software also initializes Timer to generate "Fine Pulse Output" signal 52 with a relative delay Td'.

In FIG. 4 $\Delta T_{ref}$ is referring to the time between a first pulse and a second pulse of the "Reference Pulse Output", and $\Delta T_{fpo}$ is referring to the time between a first pulse and a second pulse of the "Fine Pulse Output". The cycle-by-cycle jitter of the "Fine Pulse Output" 52 depends on the frequency $f_{clk}$ of the Timer clock source and can be expressed:

$$\text{Fine\_Pulse\_Output\_Jitter} = \Delta T_{ref} - \Delta T_{fpo} \in \langle 0, T_{clk} \rangle \qquad \text{EQ.3}$$

where $T_{clk}=1/f_{clk}$ is period and $f_{clk}$ is frequency of the Timer clock source.

The principle of delaying a pulse output allows the processor 8 to calculate the relative delay Td', which is the closest approximation of the reference delay Td between the reference pulse edge and previous calculation step [n−1]. For example, calculating the relative delay Td'1, in step [n], can be performed using any approximation or interpolation method leveraging state variables obtained in most recent k+1 calculation steps: [n] . . . [n−k].

Figure 5:
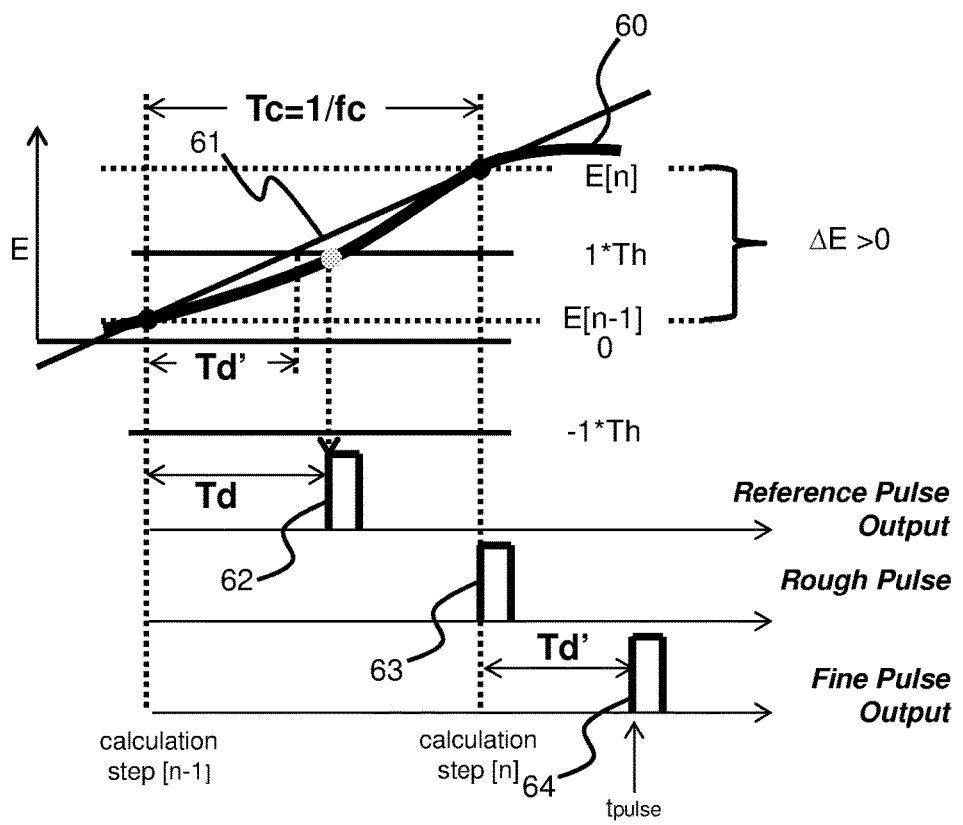
FIGS. 5 and 6 show graphs to explain the use of the first-order linear approximation method and its derivation for calculation relative delay Td' of respectively increasing and decreasing instantaneous active energy consumption $E_A(t)$.

In an embodiment, a first-order linear approximation method is shown as a reference. FIG. 5 explains the use of the first-order linear approximation method and its derivation for calculation relative delay Td' from measurements in 2 steps: [n] . . . [n−1]. In this embodiment, the calculated relative delay Td' is considered as the closest linear approximation of the reference delay Td.

Figure 6:
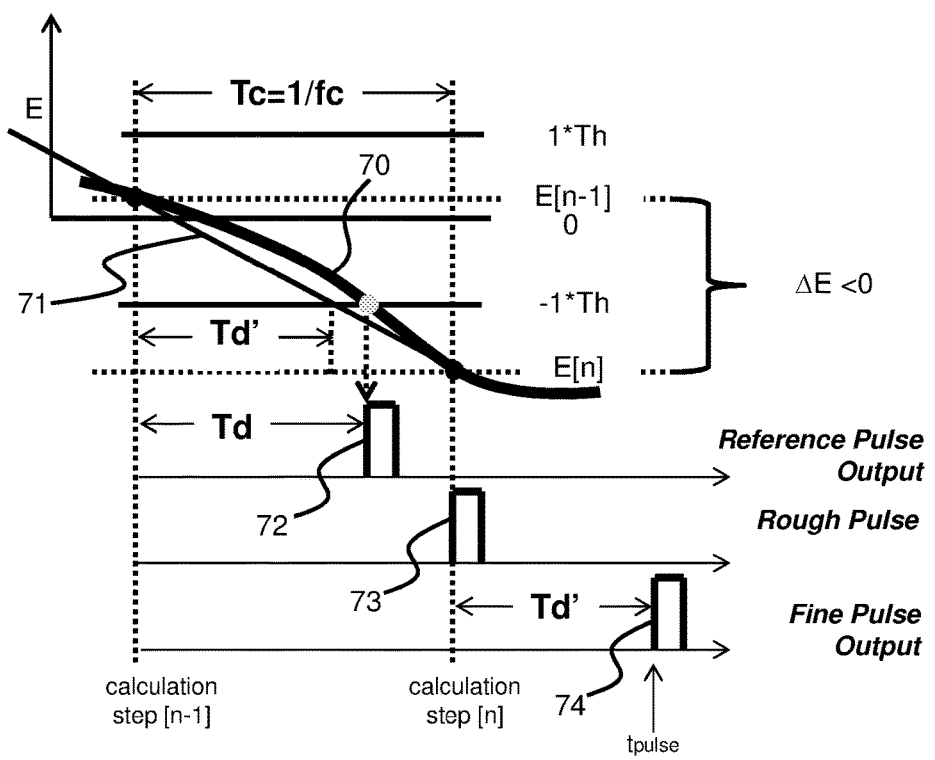

The FIGS. 5 and 6 describe cases of respectively increasing and decreasing instantaneous active energy consumption $E_A(t)$. Note that decreasing energy consumption de facto means generating active energy instead of consumption so the active energy flow is in the opposite direction e.g. from home solar panel installation back to the distribution network. Modern power meters support 4-quadrant active and reactive energy measurements. Their testing and production calibration is carried out through pulse output LED interface regardless of measurement quadrant. Hence it is preferable that the proposed fine pulse output works for both energy consumption and energy generation measurement cases.

FIG. 5 shows a line 60 indicating the instantaneous active energy consumption E(t), which line is directly related to the curve 50 in FIG. 4 showing the active energy consumption $E_A(t)$. As compared to line 50, line 60 is moved towards the x-axis due to an algorithm explained with reference to FIG. 7.

A line 61 refers to a linear approximation of the instantaneous active energy consumption between calculation steps [n−1] and [n]. The calibration equipment 2 asserts a "Reference Pulse Output" signal 62 with the reference delay Td. In order to find the closest approximation of the reference delay Td (i.e. Td'), the first the energy contribution ΔE, which represents energy consumption adder in time between calculation steps [n−1] and [n], is computed. Secondly, the energy adder ΔE is added to the total energy consumption from step [n−1] to form the total energy consumption energy in step [n]. Finally, the relative delay Td' can be expressed with the help of state variables:

$$Td' = T_c \frac{|Th| - |E[n-1]|}{|E[n]| - |E[n-1]|}$$ EQ. 4 where $T_c$ is the calculation step in seconds, Th is active energy pulse output threshold, E[n−1] is total active energy in step [n−1] and E[n] is total active energy in step [n].

A simple timer or any means of hardware may be used to generate the "Fine Pulse Output". The "Fine Pulse Output" 64 asserted at time $t_{pulse}$ in FIG. 5 is delayed relative to the "Rough Pulse" 63. The timer may be programmed at calculation step [n] to assert the "Fine Pulse Output" with a relative delay Td', which is the closest linear approximation of the reference delay Td. In power metering application, the most simple first-order (linear) approximation will give satisfactory results.

Similarly to the consumption of active energy, as shown in FIG. 5, a line 70 in FIG. 6 indicates the generation of active energy E(t), and a line 71 indicates a linear approximation of the active energy consumption between calculation steps [n−1] and [n]. In this case the active energy is negative, hence flowing in the opposite direction from home to utility. Using the same calculation methods as in FIG. 5, the Td' can be calculated for this case as well. Reference numbers 72, 73, 74 indicate the "Reference Pulse Output", the "Rough Pulse" and the "Fine Pulse Output" respectively.

Figure 7:
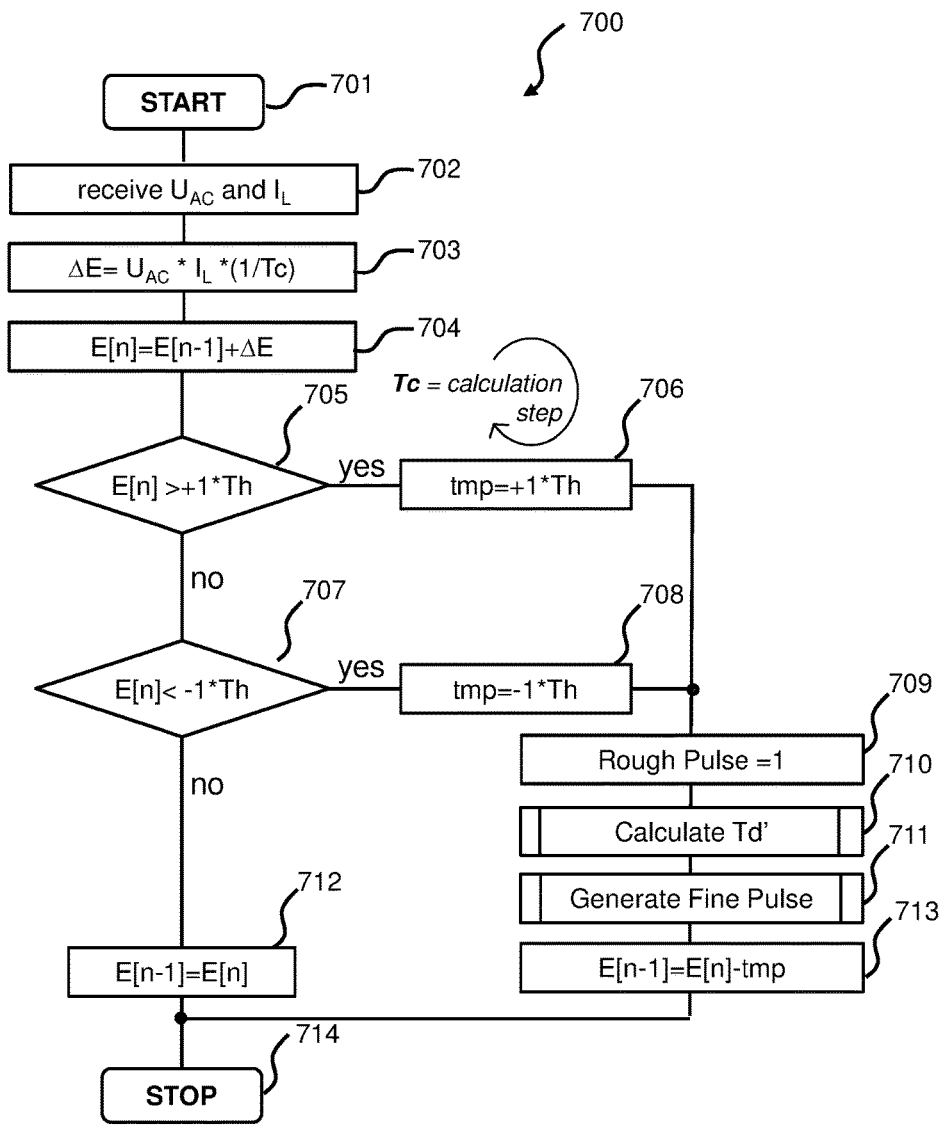
FIG. 7 shows a flow chart illustrating a method of "Fine Pulse Output" generation according to an embodiment.

FIG. 7 shows a flow chart illustrating a method 700 of "Fine Pulse Output" generation according to an embodiment. The method 700 may be performed in a software loop or a dedicated software task executed on the microcontroller 8 of the power meter 1 or any other programmable logic device arranged in or in communication with the power meter 1. Instead of a microcontroller, a microprocessor could be used, which in that case will interact with external components to implement program memory, ram memory and Input/output.

The method starts with measuring phase voltage $U_{AC}$ and phase current $I_L$ samples in a step 702. Then in a step 703, a ΔE value is calculated. Next in a step 704, an energy value E[n] is calculated by adding a reminder value E[n−1] to the calculated ΔE value. In a first test step 705, the energy value E[n] is compared to a positive threshold value (i.e. +1*Th); if the energy value is higher than the positive threshold value, the method continues with a step 706 that sets the temporary variable tmp to the positive threshold value, and next a step 709 follows in which a "Rough Pulse" trigger signal is set to 1, and a step 710 in which Td' is calculated, and a step 711 for generating the "Fine Pulse Output". Finally, in a step 713, E[n−1] is calculated as energy value E[n] minus the temporary variable tmp.

If the first test step 705 is evaluated as false then execution of the second test step 707 begins. In second test step 707, the energy value E[n] is compared to a negative threshold value (i.e. −1*Th); if the energy value is lower than the negative threshold value, the method continues with a step 708 that sets the temporary variable tmp to the negative threshold value, and next the steps 709, 710, 711 and 713 follow.

If none of the test steps 705 and 707 are evaluated as true then the reminder is loaded with the energy value. The method 700 repeats for every calculation step [n]. The method for clearing (i.e. resetting) "Rough Pulse" trigger signal is not relevant for explanation hence not shown in the flowchart.

Figure 3:
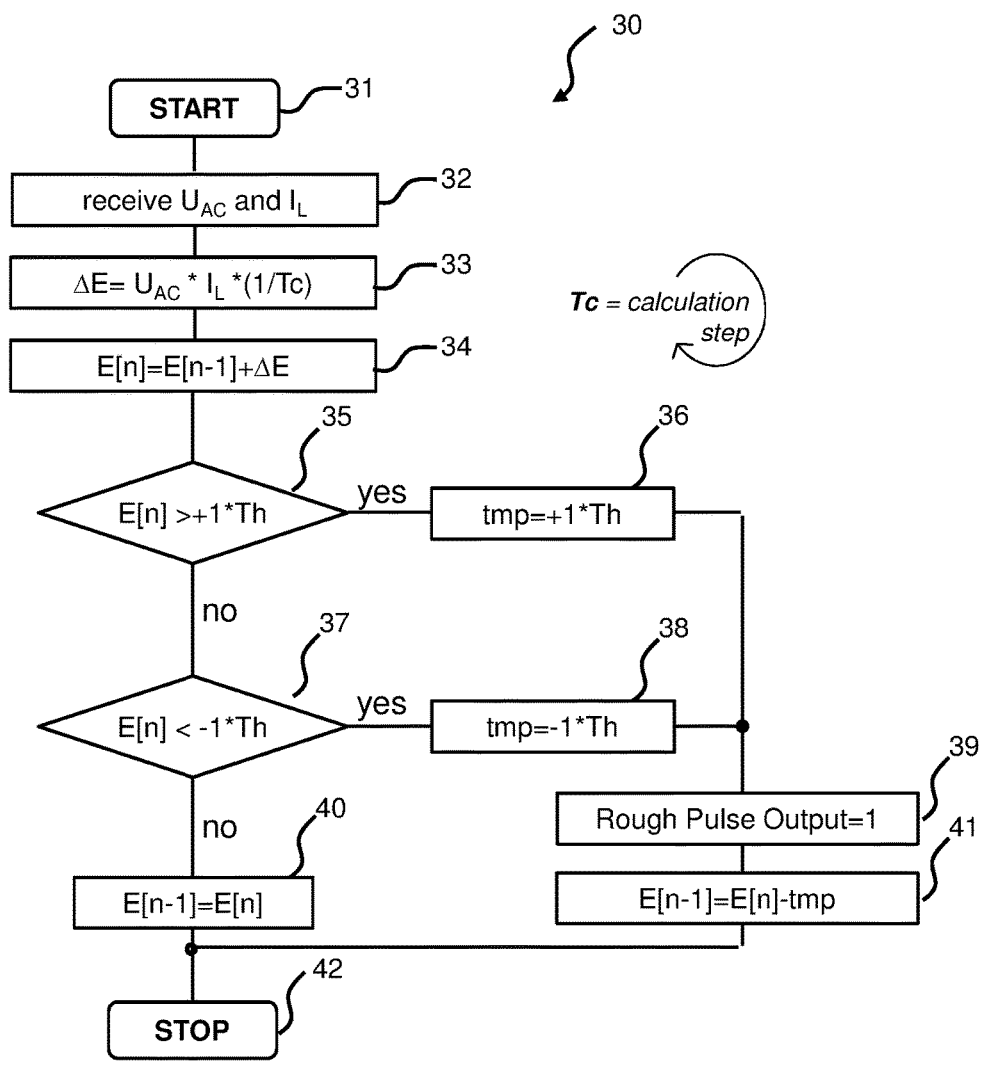
FIG. 3 shows a flow chart illustrating a method of "Rough Pulse Output" generation according to the state of the art.

It is noted that the algorithm of FIG. 7 extends the prior-art method of FIG. 3 by the computation of a relative delay Td' and the generation of a delayed edge of the "Fine Pulse Output" as compared to the edge of a "Rough Pulse" trigger signal.

Figure 8:
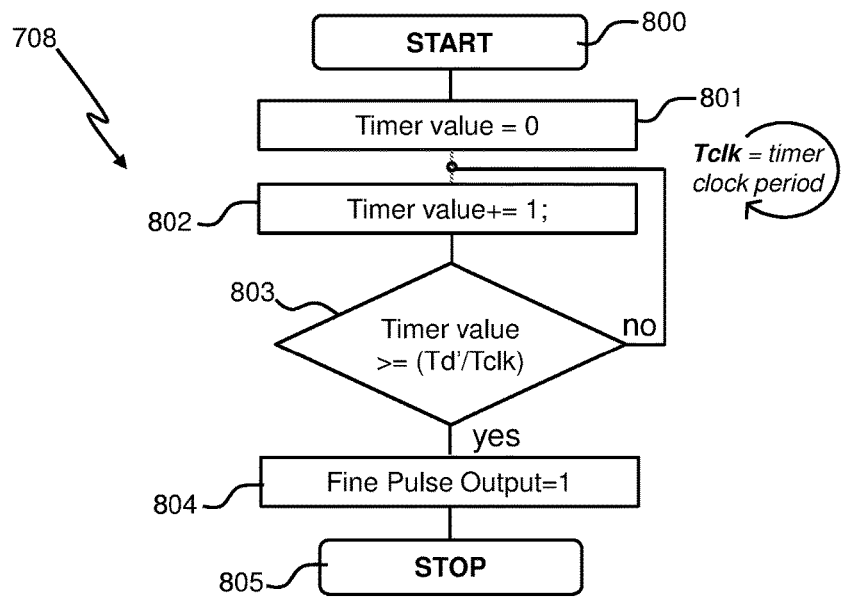
FIG. 8 is a flow chart of one of the method steps of FIG. 7 according to an embodiment.

FIG. 8 is a flow chart of the method step 711 of FIG. 7 according to an embodiment. After the start 800, a timer value is initiated in a step 801, next the timer value is incremented in a step 802. This is done every timer clock period until the timer value is higher than, or equal to, the value Td'/$T_{clk}$, see step 803. If the timer value has reached Td'/Tclk, then the "Fine Pulse Output" is set to 1, and then the method 708 ends at 805. The method for clearing "Fine Pulse Output" is not relevant for explanation thus not shown in the flowchart.

Figure 9:
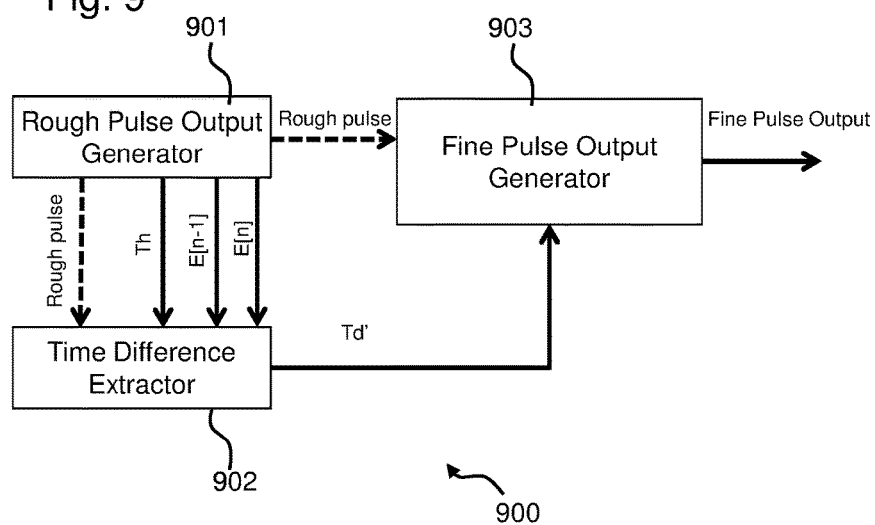
FIG. 9 shows a schematic diagram of a pulse output system for an energy consumption meter device according to an embodiment.

FIG. 9 shows a schematic diagram of a pulse output for an energy consumption meter device according to an embodiment. The system 900 may be embodied using software running on the processor 8. The system 900 comprises a rough pulse output generator 901, a time difference extractor 902 and a fine pulse output generator 903. The rough pulse output generator 901 may use known algorithms (e.g. FIG. 3) to generate the "Rough Pulse" trigger signal 53. The "Rough Pulse" trigger signal 53 in this embodiment triggers operation of the time difference extractor 902 and fine pulse output generator 903. Upon receipt of the trigger signal, the time difference extractor 902 calculates the time delay Td' using known threshold Th, reminder E[n−1], and energy E[n] state variables (see EQ.4). As noted, the "Rough Pulse" trigger signal also initiates the fine pulse output generator 903. The fine pulse output generator 903 may initialize a timer counter upon a "Rough Pulse" signal edge; the fine pulse output generator 903 asserts the "Fine Pulse Output" after a relative delay Td'.

So there is provided an energy consumption meter device comprising a sampling unit 9 arranged to sample, at a sampling frequency $f_{out}$, a measured voltage value and a measured current value. The device 1 also comprises a processor, such as the microcontroller 8, arranged to repeatedly perform on each of a plurality of calculation steps [ . . . , n−1, n, n+1, . . . ] and with a time period $T_c$ equal to $1/f_{out}$, a number of actions. First it receives a sampled voltage value $U_{AC}$ and a sampled current value $I_L$ from said sampling unit 9. Next it calculates an energy contribution value ΔE using formula: $\Delta E = U_{AC} * I_L * 1/T_c$. And next it calculates an energy value E[n] using formula: E[n]=E[n−1]+ΔE, with E[n−1] being a reminder value which was calculated at a previous calculation step.

The processor 8 will then test if the energy value E[n], is lower than −1*Th or if the energy value E[n] is higher than +1*Th, with Th being a positive constant threshold value equal to a difference between two predefined adjacent energy levels ($L_k$, $L_{k+1}$), and if so, it will calculate a relative delay Td' using the threshold value, the reminder value and the energy value. Next, an output pulse is generated at an output time $t_{pulse}$ which is delayed for said relative delay Td' with respect to a present calculation step [n]. Finally, the reminder value E[n−1] is updates as follows:

$$E[n-1]=E[n]+Th, \text{ if } E[n]<-1*Th, \text{ or} \quad \text{a)}$$

$$E[n-1]=E[n]-Th, \text{ if } E[n]>+1*Th. \quad \text{b)}$$

If the energy value E[n] is not lower than −1*Th and not higher than +1*Th, the reminder value E[n−1] is set to the energy value E[n].

By delaying the output pulse with a value which is a closest proximity of Td, the cycle-by-cycle jitter being defined as $\Delta T_{ref} - \Delta T_{fpo}$, see FIG. 4, is less or equal to the clock frequency of the timer $t_{clk}$. The smaller jitter shortens the calibration time and makes the power meters manufacturing faster and cheaper. It also guarantees an absolute metering accuracy while keeping the system design simple. It further enables to keep the required CPU load low, hence the power consumption low as well (key for el. metering). Furthermore, the proposed method allows a cost reduction of existing systems based on the (analogue) ASIC by making a system fully digital utilizing existing MCU technology.

The processor 8 may be arranged to initiate a counter at the calculation step [n], and increment the counter with a timer clock frequency $f_{clk}$ which timer clock frequency $f_{clk}$ is larger than said calculation frequency $f_c$, and generate the output pulse once the counter is equal or higher than $Td'/T_{clk}$.

By delaying the output pulse with a value which is a closest proximity of Td using a relatively high clock frequency $f_{clk}$, the jitter will be smaller than $1/f_{clk}$ which is smaller than in the state of the art where the jitter can be about $1/f_c$.

Preferably the timer clock frequency $f_{clk}$ is larger than 100 times the sampling frequency fout, and more preferably more than 1000 times the sampling frequency $f_{out}$.

The processor 8 may be arranged to calculate the relative delay Td' using an approximation or interpolation method based on state variables obtained in previous k+1 calculation steps: [n] [n−k], with n, k being integer values. An example is the linear approximation described with reference to FIGS. 5 and 6.

The invention may also be implemented in a computer program for running on a computer system, at least including code portions for performing steps of a method according to the invention when run on a programmable apparatus, such as a computer system or enabling a programmable apparatus to perform functions of a device or system according to the invention. The computer program may for instance include one or more of: a subroutine, a function, a procedure, an object method, an object implementation, an executable application, an applet, a servlet, a source code, an object code, a shared library/dynamic load library and/or other sequence of instructions designed for execution on a computer system. The computer program may be provided on a data carrier, such as a CD-rom or diskette, stored with data loadable in a memory of a computer system, the data representing the computer program. The data carrier may further be a data connection, such as a telephone cable or a wireless connection.

So, there is also provided a computer program product comprising instructions for causing a processor to perform a method as described in one or more of the embodiments above.

Figure 10:
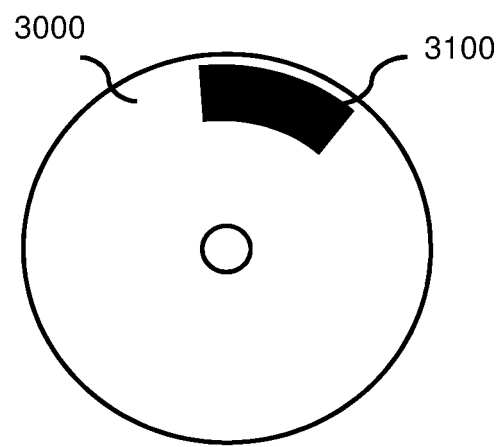
FIG. 10 shows a computer readable medium comprising a computer program product according to an aspect of the invention.

FIG. 10 shows a computer readable medium 3000 comprising such a computer program product. The computer program product 3100 comprising instructions for causing a processor to perform the method as described above. The computer program product 3100 may be embodied on the computer readable medium 3000 as physical marks or by means of magnetization of the computer readable medium 3000. However, any other suitable embodiment is conceivable as well. Furthermore, it will be appreciated that, although the computer readable medium 3000 is shown in FIG. 10 as an optical disc, the computer readable medium 3000 may be any suitable computer readable medium, such as a hard disk, solid state memory, flash memory, etc., and may be non-recordable or recordable.

The term "program," as used herein, is defined as a sequence of instructions designed for execution on a computer system. A program, or computer program, may include a subroutine, a function, a procedure, an object method, an object implementation, an executable application, an applet, a servlet, a source code, an object code, a shared library/dynamic load library and/or other sequence of instructions designed for execution on a computer system.

In the claims, any reference signs placed between parentheses shall not be construed as limiting the claim. The word 'comprising' does not exclude the presence of other elements or steps then those listed in a claim. Furthermore, Furthermore, the terms "a" or "an," as used herein, are defined as one or more than one. Also, the use of introductory phrases such as "at least one" and "one or more" in the claims should not be construed to imply that the introduction of another claim element by the indefinite articles "a" or "an" limits any particular claim containing such introduced claim element to inventions containing only one such element, even when the same claim includes the introductory phrases "one or more" or "at least one" and indefinite articles such as "a" or "an." The same holds true for the use of definite articles. Unless stated otherwise, terms such as "first" and "second" are used to arbitrarily distinguish between the elements such terms describe. Thus, these terms are not necessarily intended to indicate temporal or other prioritization of such elements. The mere fact that certain measures are recited in mutually different claims does not indicate that a combination of these measures cannot be used to advantage.

In the foregoing specification, the invention has been described with reference to specific examples of embodiments of the invention. It will, however, be evident that various modifications and changes may be made therein without departing from the broader scope of the invention as set forth in the appended claims.

The invention claimed is:

1. An energy consumption meter device, said device comprising:
a sampling unit arranged to sample, at a sampling frequency fout, a measured voltage value and a measured current value; and
a processor arranged to repeatedly perform on each of a plurality of calculation steps [ . . . , n−1, n, n+1, . . . ] and with a time period Tc equal to 1/fout, the following actions:
receive a sampled voltage value UAC and a sampled current value IL from said sampling unit,
calculate an energy contribution value ΔE using formula:

$$\Delta E = UAC * IL * 1/Tc,$$

calculate an energy value E[n] using formula:

$$E[n] = E[n-1] + \Delta E,$$

with E[n−1] being a reminder value which was calculated at a previous calculation step,
test if said energy value E[n], is lower than −1*Th or if said energy value E[n] is higher than +1*Th, with Th being a positive constant threshold value equal to a difference between two predefined adjacent energy levels, and if so:
calculate a relative delay Td' using said threshold value, said reminder value and said energy value,
generate an output pulse at an output time tpulse which is delayed for said relative delay Td' with respect to a present calculation step [n], and update said reminder value E[n−1] as follows:

$$E[n-1] = E[n] + Th, \text{ if } E[n] < -1*Th, \text{ or} \quad \text{a)}$$

$$E[n-1] = E[n] - Th, \text{ if } E[n] > +1*Th; \quad \text{b)}$$

and if not so:
set said reminder value E[n−1] to said energy value E[n],
wherein the processor is further arranged to:
initiate a timer value at said present calculation step [n],
increment said timer value with a timer clock frequency fclk which is larger than said sampling frequency fout, and
generate said output pulse once said timer value is equal or higher than Td'/Tclk.

2. An energy consumption meter device according to claim 1, wherein said timer clock frequency fclk is larger than 100 times said sampling frequency fout.

3. An energy consumption meter device according to claim 2, wherein said timer clock frequency fclk is larger than 1000 times said sampling frequency fout.

4. An energy consumption meter device according to claim 1, wherein said processor (8) is arranged to calculate said relative delay Td' using an approximation or interpolation method based on k+1 state variables obtained in previous k+1 calculation steps: [n] . . . [n−k], with n, k being integer values.

5. An energy consumption meter device according to claim 1, wherein said processor is arranged to calculate the relative delay Td' using a first-order linear approximation method and wherein $$Td' = T_c \frac{|Th| - |E[n-1]|}{|E[n]| - |E[n-1]|}$$

with
Td' being said relative delay,
Tc being said calculation time period,
Th being said threshold value,
E[n−1] being said reminder value,
E[n] being the energy value in step [n].

6. An energy consumption meter device according to claim 1, wherein said processor comprises:
a first pulse generator arranged to:
receive said sampled voltage value UAC and said sampled current value IL from said sampling unit;
calculate said energy contribution value ΔE using said sampled voltage value and said sampled current value;
calculate said energy value E[n] by adding said energy contribution value ΔE to said reminder value E[n−1], said reminder value being calculated in a previous calculation step;
create a trigger if said energy value E[n] is either smaller than −1*Th or higher than +1*Th, with Th being a positive constant threshold value equal to a difference between two predefined adjacent energy levels;
a time difference extractor arranged to:
receive said trigger from said first pulse generator;
receive said threshold value, said reminder value and said energy value from said first pulse generator;
calculate a relative delay Td' using said threshold value, said reminder value and said energy value;
a second pulse generator arranged to:
receive said trigger from said first pulse generator;
receive said relative delay Td' from said time difference extractor;
generate said output pulse which is delayed relative to a receipt time of the trigger for a time period equal to said relative delay Td'.

7. Method of a generating a pulse, said pulse being indicative for an amount of energy consumption, said method comprising:
receiving a sampled voltage value UAC and a sampled current value IL from a sampling unit at a sampling frequency fout, in which a time period Tc equals 1/fout;
calculating an energy contribution value ΔE using formula:

$$\Delta E = UAC * IL * 1/Tc;$$

calculating an energy value E[n] using formula:

$$E[n] = E[n-1] + \Delta E,$$

with E[n−1] being a reminder value which was calculated at a previous calculation step;
testing if said energy value E[n], is lower than −1*Th or if said energy value E[n] is higher than +1*Th, with Th being a positive constant threshold value equal to a difference between two predefined adjacent energy levels, and if so:
calculating a relative delay Td' using said threshold value, said reminder value and said energy value, and
generating an output pulse at an output time tpulse which is delayed for said relative delay Td' with respect to a present calculation step [n], and updating said reminder value E[n−1] as follows:

$$E[n-1]=E[n]+Th, \text{ if } E[n]<-1*Th, \text{ or} \qquad \text{a)}$$

$$E[n-1]=E[n]-Th, \text{ if } E[n]>+1*Th; \qquad \text{b)}$$

and if not so:
    setting said reminder value E[n−1] to said energy value E[n],
wherein the method further comprises:
    initiating a timer value at said present calculation step [n];
    incrementing said timer value with a timer clock frequency fclk which is larger than said sampling frequency fout;
    generating said output pulse once said timer value is equal or higher than Td'/Tclk.

8. Method of a generating a pulse according to claim 7, wherein said timer clock frequency fclk is larger than 100 times said sampling frequency fout.

9. Method of a generating a pulse according to claim 7, wherein said timer clock frequency fclk is larger than 1000 times said sampling frequency fout.

10. Method of a generating a pulse according to claim 7, wherein said calculating of said relative delay Td' comprises using an approximation or interpolation method based on k+1 state variables obtained in previous k+1 calculation steps: [n] . . . [n−k], with n, k being integer values.

11. Method of a generating a pulse according to claim 7, wherein said calculating of said relative delay Td' is performed by using a first-order linear approximation method and wherein $$Td' = T_c \frac{|Th| - |E[n-1]|}{|E[n]| - |E[n-1]|}$$

with
    Td' being said relative delay,
    Tc being said calculation time period,
    Th being said threshold value,
    E[n−1] being said reminder value,
    E[n] being the energy value in step [n].

\* \* \* \* \*